(12) United States Patent
Leboucher

(10) Patent No.: US 9,726,986 B2
(45) Date of Patent: Aug. 8, 2017

(54) TRAY FOR AN EXPOSURE MACHINE

(71) Applicant: Altix, Val de Reuil (FR)

(72) Inventor: Arnaud R. Leboucher, Franqueville-Saint-Pierre (FR)

(73) Assignee: Altix, Val de Reuil (FR)

( * ) Notice: Subject to any disclaimer, the term of this patent is extended or adjusted under 35 U.S.C. 154(b) by 205 days.

(21) Appl. No.: 14/533,778

(22) Filed: Nov. 5, 2014

(65) Prior Publication Data
US 2015/0124235 A1    May 7, 2015

(30) Foreign Application Priority Data

Nov. 6, 2013   (FR) ...................................... 1360868

(51) Int. Cl.
*G03B 27/58*   (2006.01)
*H02K 41/02*   (2006.01)
(Continued)

(52) U.S. Cl.
CPC ............ *G03F 7/70716* (2013.01); *G03F 7/20* (2013.01); *G03F 7/707* (2013.01);
(Continued)

(58) Field of Classification Search
CPC ......... G03F 2007/2067; G03F 2007/22; G03F 9/7011; H01L 21/68; H01L 21/682;
(Continued)

(56) References Cited

U.S. PATENT DOCUMENTS 5,255,607 A * 10/1993 Nishiyama ................ G03F 9/00
                                                        101/463.1
5,611,146 A    3/1997 Ducret
(Continued)

FOREIGN PATENT DOCUMENTS

JP       H0749572      2/1995
JP       2008275807    11/2008

OTHER PUBLICATIONS

Search Report for FR Application No. 1360868, mailed Sep. 3, 2015, 2 pages.

*Primary Examiner* — Colin Kreutzer
(74) *Attorney, Agent, or Firm* — Lee & Hayes, PLLC

(57) ABSTRACT

A tray for a panel exposure machine, and also such a machine, enabling a panel to be retained and pressed down so as to be presented facing an exposure device. The tray comprises a work surface (13) adapted to receive panels of different sizes, said work surface (13) being substantially plane and possessing first and second adjacent edges (13a, 13b) extending along substantially orthogonal first and second directions (X, Y) defining a reference corner (C); and first and second holder devices (30a, 30b) of a first type and at least a first holder device (40a) of a second type, each holder device being actuatable between a holding, first state in which it exerts pressure directed towards the work surface (13), thereby defining a holding position, and a rest, second state in which said pressure is released; a positioning device (14) arranged along at least a portion of the first edge (13a) and along at least a portion of the second edge (13b); the holder devices (30a, 30b) of the first type extend along at least a portion of the first and second edges (13a, 13b) respectively, their holding positions being fixed in a plane parallel to the work surface; the holder device (40a) of the second type is movable in a plane parallel to the work surface (13) in order to adapt its holding position as a function of the size of the panel in use.

15 Claims, 11 Drawing Sheets

(51) Int. Cl.
   *G03F 7/20* (2006.01)
   *H01L 21/687* (2006.01)
   *H05K 3/00* (2006.01)

(52) U.S. Cl.
   CPC .... *G03F 7/70825* (2013.01); *H01L 21/68728* (2013.01); *H05K 3/0008* (2013.01); *H05K 2203/0165* (2013.01)

(58) Field of Classification Search
   CPC ......... H01L 21/68721; H01L 21/68728; H01L 21/68735; H05K 3/0008; H05K 2203/0165
   USPC ..................... 310/12.05, 12.06; 355/72, 74
   See application file for complete search history.

(56) References Cited

U.S. PATENT DOCUMENTS

| | | | |
|---|---|---|---|
| 5,797,317 A | | 8/1998 | Lahat et al. |
| 6,000,337 A | * | 12/1999 | Blake .................... B65H 1/266 101/477 |
| 6,211,945 B1 | * | 4/2001 | Baxter ................... G03B 27/10 355/53 |
| 6,328,508 B1 | | 12/2001 | Jines |
| 9,636,793 B2 | | 5/2017 | Morgan |
| 2001/0022652 A1 | * | 9/2001 | van Schaik ............. G03F 7/707 355/53 |
| 2007/0002303 A1 | * | 1/2007 | Van De Moosdijk .. G03F 7/707 355/72 |
| 2009/0086009 A1 | | 4/2009 | Naito et al. |
| 2011/0073776 A1 | * | 3/2011 | Inoue ................. H01L 21/6838 250/492.1 |

* cited by examiner

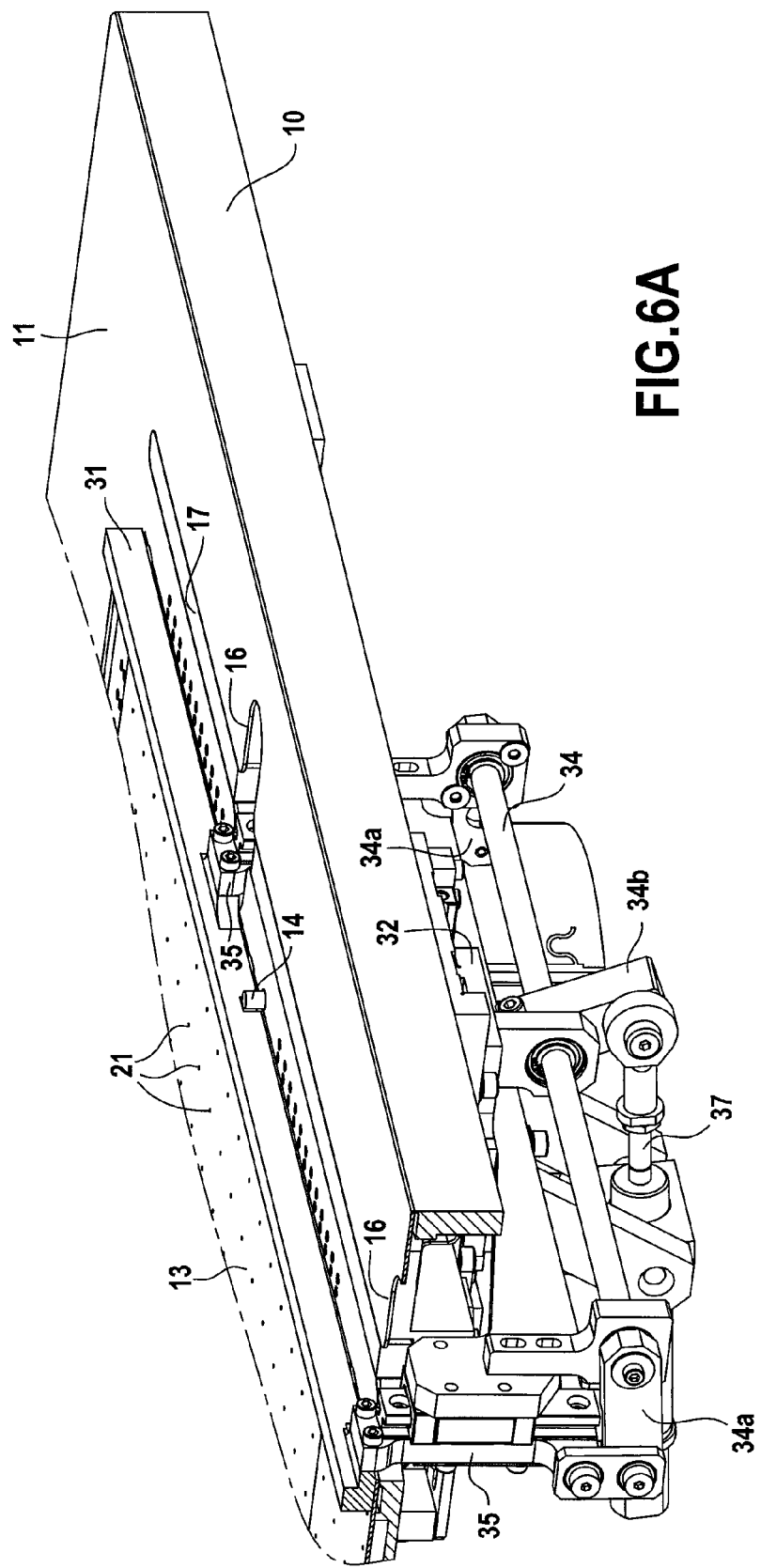

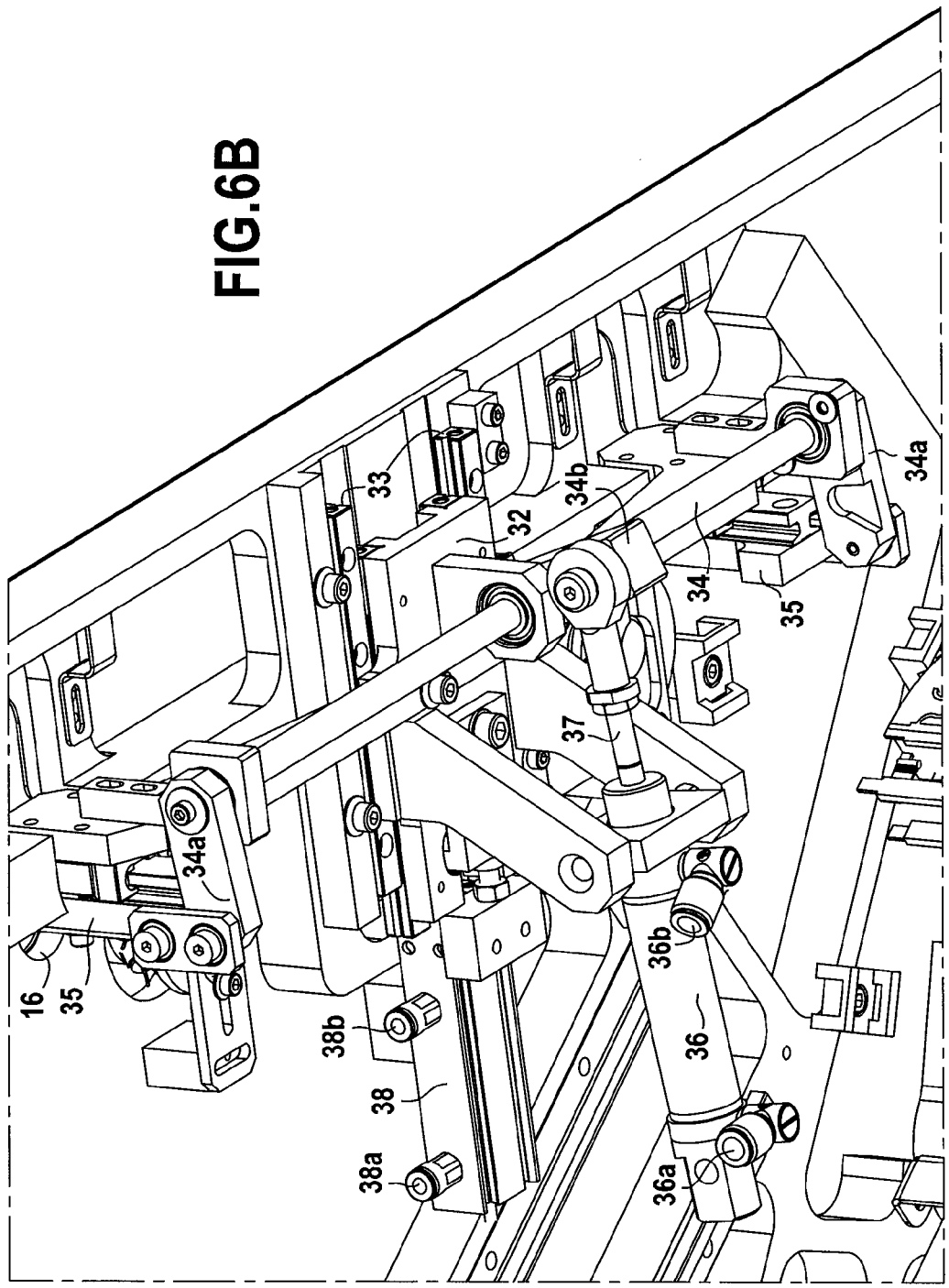

TRAY FOR AN EXPOSURE MACHINE

CROSS-REFERENCE TO RELATED APPLICATIONS

This application claims priority under 35 U.S.C. §119 to French Patent Application No. 1360868, filed Nov. 6, 2013, which is incorporated herein by reference in its entirety.

FIELD OF THE INVENTION

The present description relates to a tray for a panel exposure machine, and also to such a machine, the tray enabling a panel to be retained and pressed down in order to enable it to be presented facing an exposure device.

The field of application of the invention is mainly that of printed circuits, however the invention can also be used in any field making use of image transfer methods, such as the field of liquid crystal display (LCD) screens, touch screens, photovoltaic cells, or indeed the field of fabricating micromechanical parts by chemical etching.

STATE OF THE PRIOR ART

Among techniques for exposing panels and transferring images, the so-called "direct imaging" technique possesses the advantage of not using a physical image, commonly referred to as a "negative" even though a positive image is not impossible, with the image for transferring being projected directly from a digital negative, e.g. with the help of an exposure head having a matrix of controllable micromirrors capable of projecting an image made up of pixels and serving to pass or to block light from a light source for each pixel of the digital negative. This technique makes production much easier, particularly when changing series, since the negative can be reprogrammed easily merely by changing a file, and without any need to manipulate the exposure machine itself.

Nevertheless, such exposure heads having a matrix of micro-mirrors, which constitute the technology that is in the most widespread use in the direct imaging technique, present the defect of possessing depths of field that are small, typically of the order of 300 micrometers (μm). Under such circumstances, in order to ensure that the transferred image is sharp over the entire surface of the panel, it is necessary to ensure that the panel is sufficiently plane.

In order to ensure that the panel is plane, traditional exposure machines are generally fitted with suction devices that press the panel against the surface of the work table by suction. Nevertheless, such suction devices are not sufficient for achieving the degree of planeness that is required for such depths of field. Certain panels, in particular for printed circuits, can be very thick, having thickness of the order of several millimeters, and thus very rigid: under such circumstances, if the panel is slightly warped, the suction force is not sufficient for correcting such curvature of the panel. Panels that are thin and flexible, e.g. the inner layers of printed circuits or indeed the panels used for flexible screens or for chemical etching, also present significant problems when they have curled corners: because of the large distance between a curled portion of the panel and the suction device, the suction device cannot take hold of that portion of the panel effectively. Furthermore, with panels that are thick or thin, certain suction nozzles are constrained under such circumstances to suck in air without opposition, thereby weakening the suction force at all of the neighboring nozzles forming part of a common array, and thus reducing the extent to which the panel is pressed down over a large area.

In order to solve that insufficiency of known suction devices, one solution that has been proposed is for the work table to be fitted with four holder devices capable of bearing down against the edges of the panel in order to press them against the work table. In order to be able to accommodate panels of different sizes, each of those devices is mounted on a carriage that is movable in translation orthogonally to the edges of the panel: thus, regardless of its size, the panel is centered on the center of the table and each holder device is moved towards the inside of the table so as to reach the edge of the panel, which edge is detected with the help of sensors.

Nevertheless, that solution presents ergonomic problems for the operator in charge of loading panels. Insofar as the panel must always be centered on the table, it must always be placed at a distance from the edge of the work table, and thus at a distance from the operator's workstation: the operator thus needs to hold the panel at arms length and to lean over the table in order to place the panel at the center of the table. That uncomfortable position is made worse when the panel is small and therefore needs to be placed a long way from the edge. It can naturally be understood that this leads to arduous working conditions for the operator, e.g. running a risk of musculoskeletal disorders.

In addition, centering the panel on the table, which must be accurate in order to ensure that the projected image is aligned correctly with the panel, requires the operator to adjust the position of the panel in translation along two different directions, and also in rotation about the vertical axis, where this is made that much more difficult to perform, specifically because the panel is situated at a distance from the operator: the accuracy with which the panel is positioned is thus relatively poor, and that can give rise to problems of alignment with the exposure head.

There thus exists a real need for a tray and for an exposure machine enabling a panel to be retained and pressed down for presenting to an exposure device, which tray and machine are spared, at least in part, from the above-mentioned drawbacks inherent to known devices.

SUMMARY OF THE INVENTION

The present description provides a tray adapted to present a panel facing an exposure device in a panel exposure machine, the tray comprising a work surface adapted to receive panels of different sizes, said work surface being substantially plane and possessing first and second adjacent edges extending along substantially orthogonal first and second directions defining a reference corner, and first and second holder devices of a first type and at least a first holder device of a second type, each holder device being actuatable between a holding, first state in which it exerts pressure directed towards the work surface, thereby defining a holding position, and a rest, second state in which said pressure is released, and a positioning device arranged along at least a portion of the first edge and along at least a portion of the second edge; the holder devices of the first type extend along at least a portion of the first and second edges respectively, their holding positions being fixed in a plane parallel to the work surface; and the holder device of the second type is movable in a plane parallel to the work surface in order to adapt its holding position as a function of the size of the panel in use.

In the present description, the term "panel" is used to mean any type of substantially plane substrate regardless of its thickness or of its stiffness. Typically, it may be a panel for a printed circuit or a microelectronic circuit, however it could be a sheet of metal that is to be subjected to chemical etching for fabricating micromechanical parts, or indeed a sheet of plastics material on which conductive tracks are to be made for fabricating flexible touch screens or photovoltaic cells.

By means of this tray and by using a reference corner, the operator can work closer to the panels, regardless of their size. This configuration provides for the panel to be placed against the first and second edges of the work surface, thereby enabling the operator to be positioned next to one of these edges so as to be able to handle the panel immediately in front of the operator.

In this way, the operations that the operator needs to perform are simple, quick, and less tiring: in particular, since the panel loading zone is immediately in front of the operator, there is no need to lean over or to work at arms length. The ergonomics of the workstation are thus greatly improved and the work is less arduous. In addition, there is a reduction in the risk of accidents at work, e.g. associated with musculoskeletal disorders.

Furthermore, the accuracy with which the panel is positioned is also improved. Arranging the panel close to the operator gives the operator better visibility and better accuracy while positioning the panel on the work surface. In addition, the positioning device guides the operator so as to ensure that the panel is correctly arranged on the work surface. Since the position of the panel is more accurate, the position of the transferred image is more accurate, thereby improving the quality of the exposed panel. This accuracy with which the image is positioned is particularly important when exposing both faces, where it is necessary for elements of the image on the front face to coincide with elements of the image on the rear face.

In addition, the proposed configuration that is based on a corner reference enables three of the four corners of the panel to be located along the first and second edges, thereby enabling them to be retained effectively by the holder devices of the first type without any particular adjustment to those devices, since these three corners are naturally located in the holding positions of those holder devices of the first type. In this way, and unlike movable devices of position that needs to be adjusted as a function of the size of the panel, potential positioning errors are avoided that might otherwise reduce the effectiveness with which the panel is pressed down or might interfere with the working area of the panel.

Such holder devices that do not need to be moved along the work surface are also simpler to design and install: they are therefore less expensive. They are also lighter in weight, which is a major advantage when the tray is itself movable within the exposure machine: this enables the inertia of the tray to be reduced, thereby improving the accuracy with which it can be moved. It is also possible to move the panel at faster speeds for given accuracy.

Finally, because of this configuration, a single holder device of the second type, i.e. that is movable, suffices to hold and press down the fourth corner of the panel. In addition, because of the corner reference and because of the very accurate arrangement of the panel, it is possible to move and position the holder device of the second type accurately merely by knowing the size of the panel. In particular, there is no need for a sensor seeking to detect the edges of the panel in order to position this holder device of the second type.

In certain embodiments, the positioning device comprises at least one stop provided against the first edge and/or the second edge of the work surface. Preferably, the device has a plurality of stops provided against the first and second edges. These stops facilitate positioning and provide excellent accuracy since it suffices to push the panel into abutment against the stops in order to ensure that the panel is correctly positioned in each direction and also in rotation.

In certain embodiments, said stop is a peg projecting from the top face of the panel and is arranged against said edge. Such pegs are easy to put into place on the top face of the panel without interfering with the planeness of that top face.

In other embodiments, the positioning device may include visual markers, such as rulers or cross-hairs, or a step formed in the top face of the tray and defining said edge. The holder devices of the first type may also act as positioning devices when they are in their rest state by forming stops for the panel.

In certain embodiments, the first holder device of the second type is movable in translation along a stroke extending at least from a third edge of the work surface towards the interior of the work surface substantially towards the first holder device of the first type. In this way, the holder device of the second type can easily retain and press down a third edge of the panel together with its fourth corner, regardless of the length of the panel. Said third edge preferably extends in the first direction.

In certain embodiments, the stroke of the first holder device of the second type forms an angle with the first direction that lies strictly between 45° and 90°. Insofar as the width of panels generally decreases together with decreasing length, such an oblique stroke makes it possible to adapt the position of the holder device of the second type, including the transverse dimension of the panel: the holder device is moved towards the second edge so as to enable it to press against a longer length of the third edge of the panel or so as to be more centered relative to said edge.

In certain embodiments, the stroke of the first holder device of the second type forms an angle with the first direction that lies strictly between 65° and 75°. Given the usual sizes of panels and their length/width ratios, this range of angles enables a large range of panels to be retained effectively, from small panels measuring 25.4 centimeters (cm)×25.4 cm up to large panels measuring 76.2 cm×61 cm. In particular, this makes it possible to hold down at least two-thirds of the length of the third edge for panels of conventional sizes.

Nevertheless, in other embodiments, the stroke of the third holder device could be substantially orthogonal to the first direction.

In certain embodiments, the tray includes a second holder device of the second type. This makes it possible to retain and press down a fourth edge of the panel, regardless of the size of the panel.

In certain embodiments, the second holder device of the second type is movable in translation along a stroke extending at least from a fourth edge of the work surface towards the inside of the work surface and substantially towards the second holder device of the first type. In this way, this holder device of the second type can easily retain and press down the fourth edge of the panel, regardless of the width of the panel. Said fourth edge preferably extends along the second direction.

In certain embodiments, said stroke forms an angle with the second direction lying strictly between 45° and 90°. In the same manner as specified above, such an oblique stroke makes it possible to move the holder device towards the first edge so as to enable it to press down on a greater length of the fourth edge of the panel or so as to be more centered relative to said edge.

In certain embodiments, said stroke forms an angle with the second direction lying strictly between 50° and 60°. Given the usual sizes of panels and their length/width ratios, this range of angles enables a large range of panels to be retained effectively, from small panels measuring 25.4 cm×25.4 cm up to large panels measuring 76.2 cm×61 cm. In particular, this makes it possible to hold down at least two-thirds of the length of the third edge for panels of conventional sizes.

In certain embodiments, the maximum stroke of at least one holder device of the second type extends over at least 10 cm, preferably over at least 40 cm, more preferably over at least 50 cm. Such a stroke of more than 50 cm for the first holder device of the second type and of more than 40 cm for the second holder device of the second type makes it possible to cover a wide range of panels from small panels measuring 25.4 cm×25.4 cm up to large panels measuring 76.2 cm×61 cm.

In certain embodiments, the maximum lateral travel of the holder devices of the first type is less than 10 cm, preferably less than 5 cm. This small travel serves to minimize the movement of the holder device while leaving the room needed for putting the panel into place. This is made possible because of the constant positions of the first and second edges of the panel relative to these holder devices of the first type.

In this context, it should also be observed concerning holder devices of the second type, that it is possible for them to be positioned so as to be set back a little from the positions expected for the second and fourth edges of the panel, depending on the size of the panels that are to be exposed in a given series. With this rest position being conserved for an entire series, movement of the holder device is minimized when loading or unloading panels within a given series. Minimizing movements of the holder devices of the first or second types serves to shorten cycle times for each panel that is produced, thereby increasing the profitability of production.

In certain embodiments, the tray includes at least one first mover device for moving at least one holder device of the second type.

In certain embodiments, each holder device of the second type is fitted with such a mover device.

In certain embodiments, the first mover device comprises a wormscrew co-operating with a nut secured to said holder device of the second type.

In certain embodiments, said wormscrew is arranged under the work surface.

In certain embodiments, the wormscrew is rotated by a motor, preferably a stepper motor, that is fastened under the work surface.

In other embodiments, the wormscrew is fastened in stationary manner under the work surface and it is the nut of the holder device of the second type that is driven in rotation by a motor, preferably a stepper motor.

In certain embodiments, at least one and preferably each holder device includes a force applicator actuated by an actuator device configured to lower the force applicator towards the work surface in the holding state and to lift the force applicator to a distance from the work surface in the rest state. This force applicator is the member that bears against the panel in the holding state. It is moved back into the rest state in order to release the panel.

In certain embodiments, the force applicator is an oblong strip extending in the first direction or the second direction, respectively. This shape enables it to press against a long length of the edge of the panel. Where appropriate, it also makes it possible to press the corners of the panel down effectively against the work surface.

In certain embodiments, the position of the force applicator in the rest state is higher and further out than its position in the holding state. In this way, it is possible to use panels of different thicknesses without running the risk of the force applicator coming into abutment against the edge face of the panel while moving towards the holding state. In addition, in the rest state, this makes it possible to allow the panel to pass under while it is being loaded or unloaded.

In certain embodiments, the actuator device of at least one holder device of the first type comprises a first actuator configured to lift or lower the force applicator and a second actuator configured to cause the force applicator to advance or retreat laterally. Since these two actuators are distinct, each of them is dedicated to one specific task that it can carry out effectively and independently of the behavior of the other actuator. Thus, by way of example, the horizontal position of the force applicator in its holding state can be correct regardless of the thickness of the panel. Likewise, the force used by the first actuator can serve solely for preventing the panel from moving.

Nevertheless, in other embodiments, a single actuator could perform both movements simultaneously.

In certain embodiments, the first actuator comprises a jack with a movement-transmission linkage.

In certain embodiments, the second actuator comprises a jack driving the assembly formed by the first actuator and the force applicator.

In certain embodiments, the actuator device of at least one holder device of the second type comprises a single actuator configured to lift or to lower the force applicator, and the corresponding mover device is configured to cause the force applicator to advance or retreat laterally. In this way, there is no need to provide the actuator device with an additional actuator in order to perform the backward movement of the force applicator.

In certain embodiments, the first actuator comprises a jack.

In certain embodiments, the tray also includes a suction device configured to retain a panel against the work surface by suction. This device operates synergistically with the holder devices since having the panel pressed down by the holder devices reduces leaks between the panel and the suction system: under such circumstances, the suction force from the set of suction nozzles is strengthened, thereby correspondingly pressing down the panel better.

In certain embodiments, the suction device comprises a vacuum pump, preferably of the Venturi type, and an array of suction orifices opening out into the work surface.

In certain embodiments, the suction device comprises a plurality of suction arrays corresponding to distinct zones of the work surface.

In certain embodiments, the tray also includes a removable mask configured to shut off at least some suction orifices. Depending on the size of the panel, this makes it possible to mask those suction orifices that are not covered by the panel in order to preserve the suction force of the suction device. The tray preferably includes a set of several masks that are of different shapes.

In certain embodiments, the tray also includes at least one optical device provided in the work surface close to its first and/or its second edge, i.e. within less than 5 cm from said edge, and preferably less than 3 cm. The positioning device thus ensures that the panel is indeed positioned in the detection zone of the optical device.

The present description also relates to a panel exposure machine including an exposure device and a tray in accordance with any of the embodiments described above and adapted to present a panel facing the exposure device.

In certain embodiments, said exposure device is of the direct imaging type.

In certain embodiments, said tray is movable relative to the exposure device in a plane parallel to the work surface. This makes it possible to move the panel from the loading station so as to face the exposure device. This also makes it possible to move the panel while it is under the exposure device in order to expose it piece by piece when the exposure head operates in that way.

In certain embodiments, said tray is movable relative to the exposure device in the first and the second directions.

The above-mentioned characteristics and advantages, and others, appear on reading the following detailed description of embodiments of the proposed device and of implementations of the proposed method. This detailed description is made with reference to the accompanying drawings.

BRIEF DESCRIPTION OF THE DRAWINGS

The accompanying drawings are diagrammatic and seek above all to illustrate the principles of the invention.

In the drawings, from one figure to another, elements (or portions of an element) that are identical are identified by the same reference signs.

FIGS. 6A and 6B are detail views of a holder device of the first type seen from two different angles.

DETAILED DESCRIPTION OF EMBODIMENT(S)

In order to make the invention more concrete, an example of a tray and an exposure machine is described in detail below with reference to the accompanying drawings. It should be recalled that the invention is not limited to this example.

Figure 1:
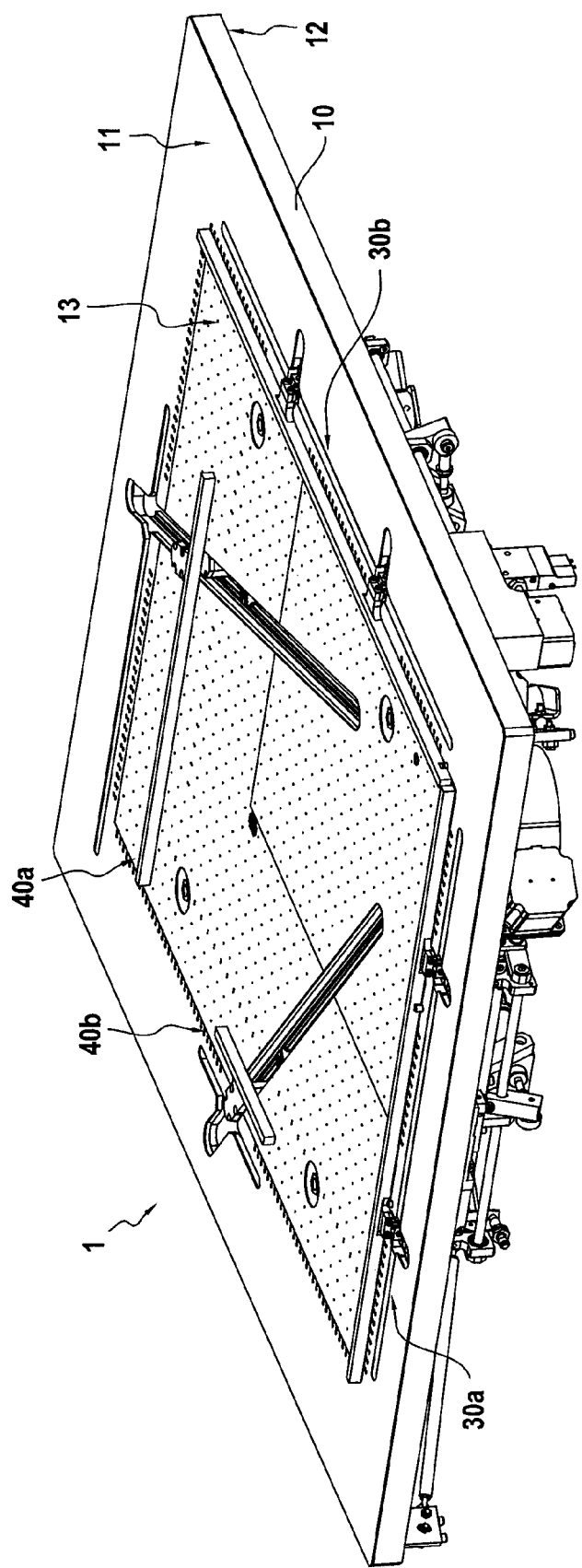
FIG. 1 is a perspective view of a tray of the invention.
Figure 2:
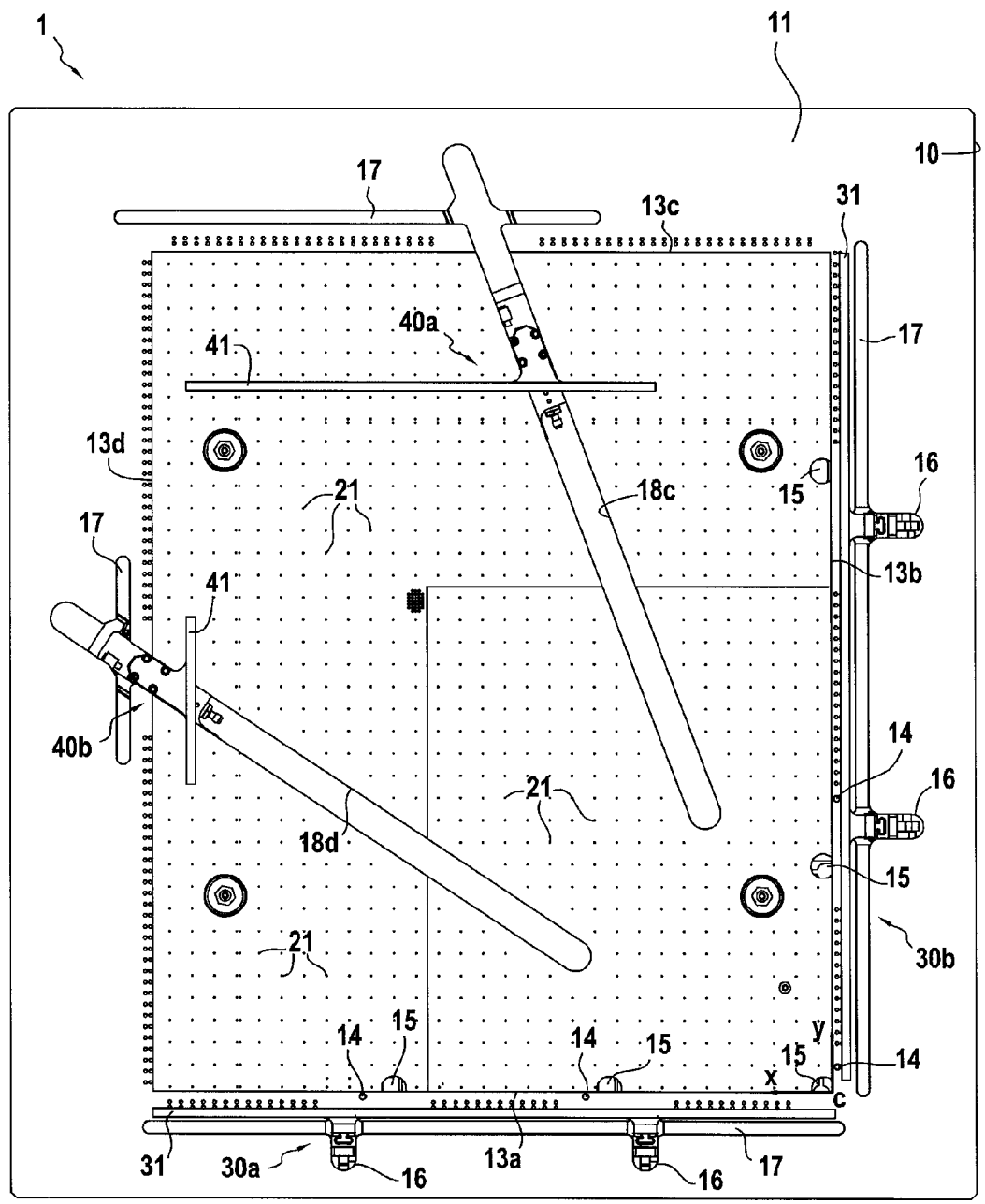
FIG. 2 is a plan view of the tray.

FIGS. 1 and 2 show an example tray 1 of the invention. This tray 1 comprises a frame 10 that is substantially in the form of a rectangular parallelepiped having a top face 11 and a bottom face 12. In order to minimize the weight of the tray, and thus its inertia in motion, the frame is of small thickness, less than 30 millimeters (mm), and its bottom surface 12 presents reinforcing ribs providing the tray 1 with overall stiffness and ensuring that its top surface 11 is plane, which surface should be plane to within tolerance of less than 200 µm. These reinforcing ribs also serve to fasten auxiliary devices to the bottom surface 12 of the frame 10.

The top surface 11 of the frame 10 presents a rectangular zone extending in two orthogonal directions X and Y, and defining a work surface 13 configured to receive a substantially rectangular panel 90 for exposure. The work surface 13 thus has first and third edges 13a, 13c parallel to the direction X and second and fourth edges 13b, 13d parallel to the direction Y. The first and second edges 13a and 13b are thus adjacent and where they intersect they define a reference corner C against which each panel 90 is positioned in use, regardless of its size.

In order to assist in such positioning, stops 14, in the form of pegs, are arranged at the surface of the frame 10 along the first and second edges 13a, 13b of the work surface 13. In this way, the positioning of a panel 90 against the reference corner C is accurate and can be performed immediately by pushing said panel 90 against the stops 14.

Optical devices 15 fastened against the bottom surface 12 of the frame 10 (see FIG. 5) and opening out in the top surface 11 in the work surface 13 are also provided in the proximity of the first and second edges 13a and 13b of the work surface 13. In the context of exposure on both faces, these optical devices 15 make it possible, where appropriate, to detect marks provided on the first face of the panel 90 so as to facilitate aligning the image on the second face of the panel 90.

The tray 1 is also provided with a suction device enabling a panel 90 to be retained by suction against the work surface 13. For this purpose, the work surface 13 has suction orifices 21 distributed over the entire work surface 13 and connected by a network of pipes (not shown) to a plurality of vacuum pumps 22 provided under the frame 10. These suction orifices 21 may be organized in different suction zones that can be activated independently of one another as a function of the size of the panel.

In order to improve retention of the panel 90 against the work surface 13, and in particular in order to ensure that its sides 90a-90a and its corners are pressed down suitably, the tray 1 also has holder devices 30a, 30b of a first type together with holder devices 40a, 40b of a second type, each configured to retain and press a respective side of the panel 90.

The first holder device 30a of the first type is arranged substantially along the first edge 13a of the work surface 13. It comprises a force applicator 31 in the form of a strip extending parallel to the first direction X over a length that is at least substantially equal to the length of the first edge 13a of the work surface 13. In this example, the strip is thus 61 cm long.

The second holder device 30b of the first type is entirely analogous to the first holder device 30a except that it is arranged substantially along the second edge 13b of the work surface 13. Its force applicator 31 is likewise in the form of a strip that extends parallel to the second direction Y over a length that is at least substantially equal to the length of the second edge 13b of the work surface 13. In this example, the strip is thus 75 cm long.

As shown in FIGS. 6A and 6B, each holder device 30a, 30b of the first type has a carriage 32 mounted to move along rails 33 arranged under the frame 10, respectively perpendicularly to the first edge 13a and to the second edge 13b of the work surface 13. Each carriage also pivotally carries a crank 34, the carriage being substantially in the middle of the crank. The force applicator 31 is mounted on the crank 34 via two uprights 35 that are located substantially at the first and second thirds along its length, the uprights passing through the frame via slots 16 and being pivotally connected to end crankpins 34a of the crank 34.

Each holder device 30a, 30b of the first type has a first actuator 36 configured to move the force applicator 31 vertically, and a second actuator 38 configured to move the force applicator 31 horizontally.

The first actuator is a pneumatic jack 36 having first and second inlets 36a and 36b secured to the carriage 32, and having a piston with a rod 37 that is connected via a pivot to a central crankpin 34b of the crank 34.

In this way, when pneumatic pressure is admitted into the chamber of the jack 36 via the first inlet 36a, the piston is pushed outwards, thereby lengthening its rod 37: the crank 34 is thus driven counterclockwise, thereby moving the uprights 35 and thus the force applicator 31 downwards, enabling a force to be exerted against the work surface 13 or against the panel 90 when such a panel 90 is placed on the work surface 13.

Conversely, when pneumatic pressure is admitted into the chamber of the jack 36 via the second inlet 36b, the piston is pushed inwards, thereby shortening its rod 37: the crank 34 is then driven clockwise, thereby driving the uprights 35 and the force applicator 31 upwards, and releasing the pressure exerted against the working surface 13 or the panel 90.

The second actuator is another pneumatic jack 38 provided with first and second inlets 38a and 38b, with its piston rod connected to the carriage 32.

In this way, when pneumatic pressure is admitted into the chamber of the jack 38 via the first inlet 38a, the piston is pushed outwards, thereby causing its rod to lengthen: the carriage 32 and thus the force applicator 31 are thus driven laterally outwards, going away from the working surface 13.

Conversely, when pneumatic pressure is admitted into the chamber of the jack 38 via the second inlet 38b, the piston is pushed inwards, thereby shortening its rod: the carriage 32 and thus the force applicator 31 thus being driven laterally inwards, facing the work surface 13.

The first holder device 40a of the second type has a force applicator 41 in the form of a strip extending parallel to the first direction X so as to be capable of retaining a major portion of the third edge 90c of the panel 90 together with its fourth corner. In this example, the strip is thus 42 cm long.

The second holder device 40b of the second type also has a force applicator 41 in the form of a strip, this strip extending parallel to the second direction Y so as to be capable of retaining a portion of the fourth edge 90d of the panel 90. In this example, this strip is 15 cm long.

Figure 5:
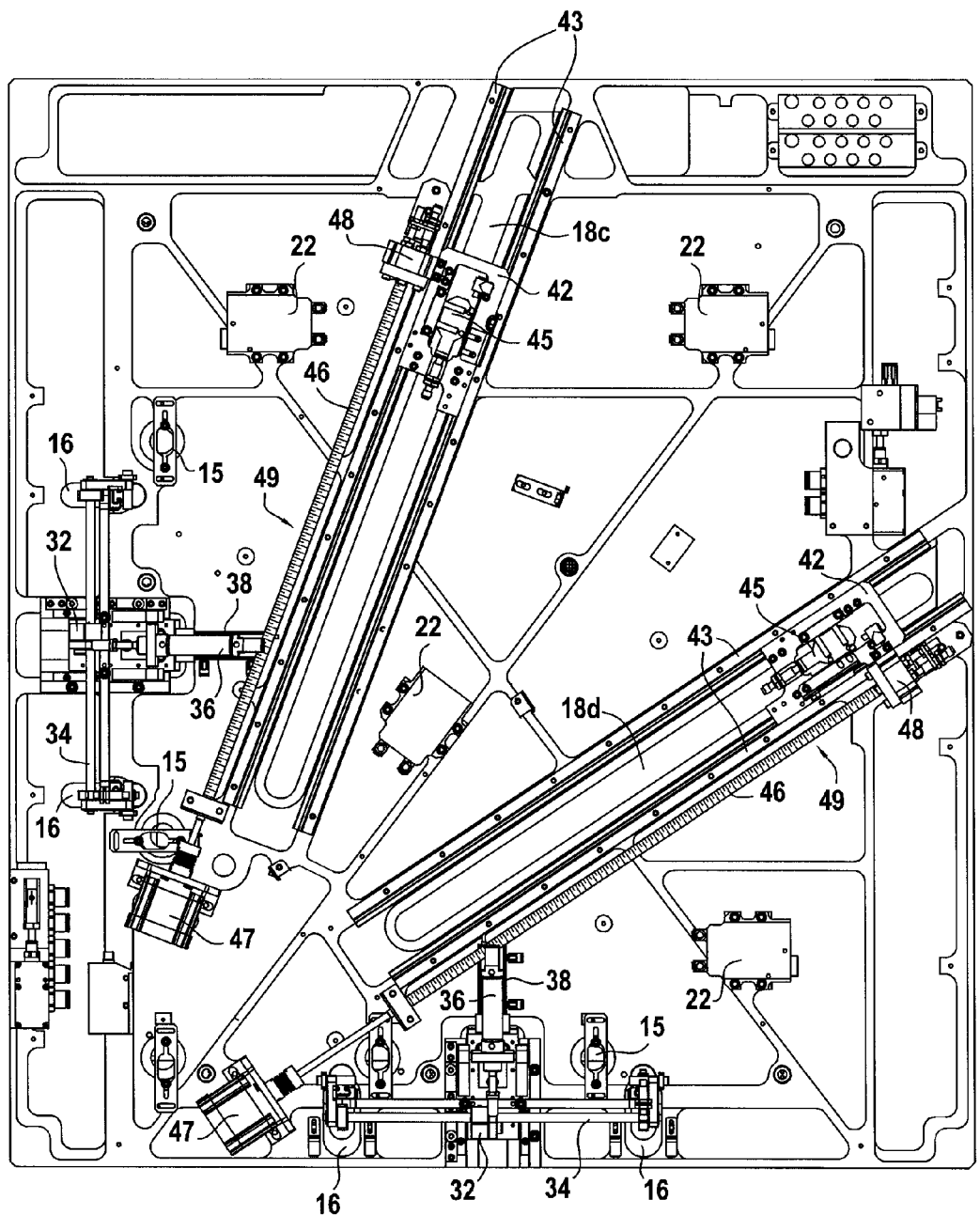
FIG. 5 is a view of the panel from beneath.
Figure 7:
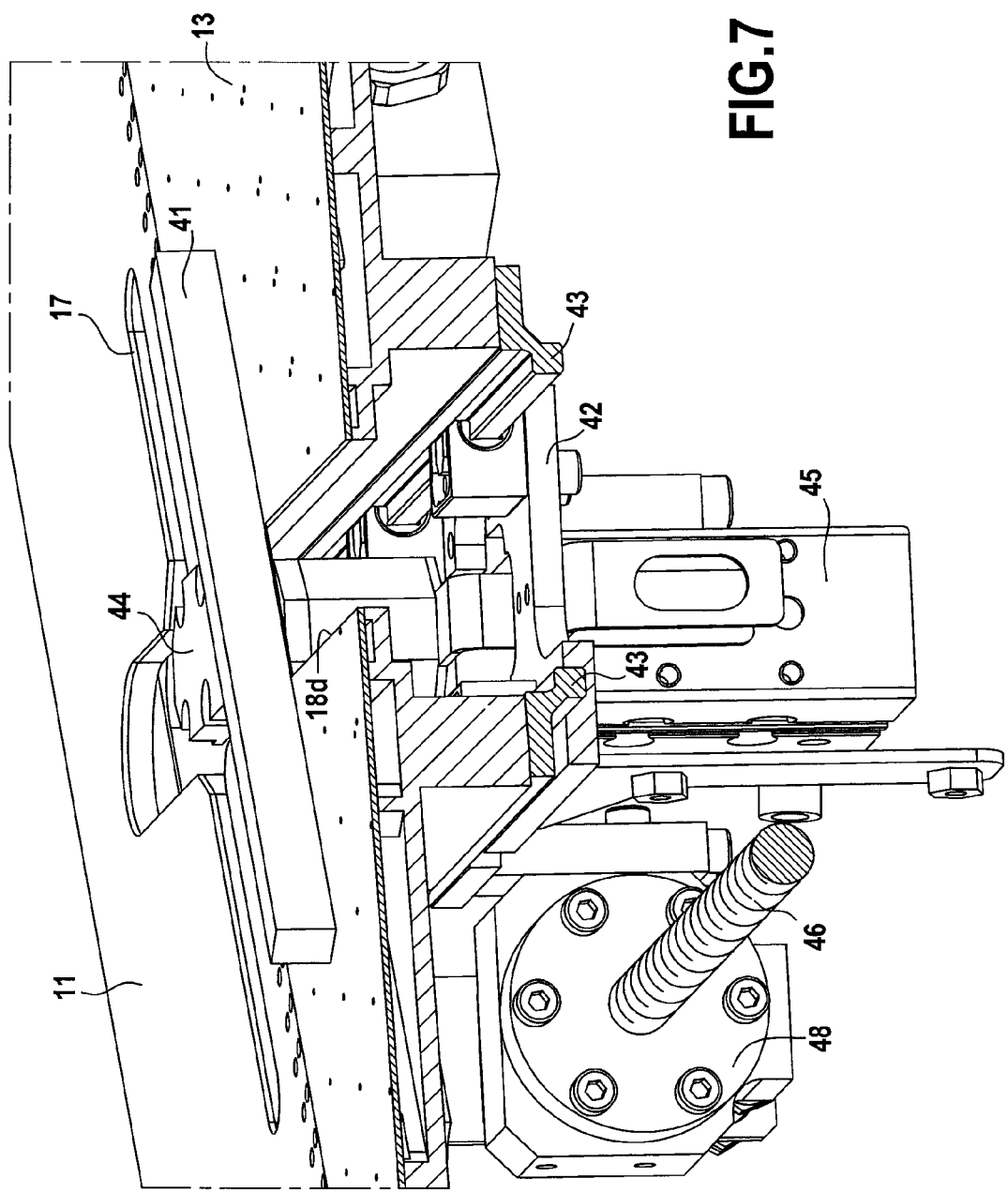
FIG. 7 is a detail view in perspective of a holder device of the second type.

As shown in FIGS. 5 and 7, each holder device 40a, 40b of the second type has a respective carriage 42 mounted to move along rails 43 arranged under the frame 10 and along a stroke extending substantially respectively from the third edge 13c or the fourth edge 13d of the work surface 13, diagonally towards the inside of the work surface 13.

The force applicator 41 is mounted on this carriage 42 via an upright 44 passing through the frame 10 via a slot 18c or 18d extending from the outside towards the inside of the work surface 13 parallel to the rails 43. Preferably, and as shown for the second holder device 40b of the second type, but which could also apply in other embodiments to the first holder device 40a of the second type, the upright 44 is provided substantially in the middle of the length of the force applicator 41.

Each holder device 40a, 40b of the second type includes an actuator 45, more precisely a pneumatic jack, configured to move the upright 44 and thus the force applicator 41 in a vertical direction.

Each holder device 40a, 40b of the second is also fitted with a mover device 49 configured to move the carriage 42 along the rails 43. For this purpose, the mover device 49 comprises a wormscrew 46 driven by a stepper motor 47; the carriage 42 is secured to a nut 48 meshing on the wormscrew 46.

The mover device 49 thus enables the carriage 42, and thus also the force applicator 41, to be moved along its stroke in order to adapt its position to the size of the panel 90 in use.

In order to protect the force applicators 31, 41 of each of the holder devices 30a, 30b, 40a, 40b when the tray 1 is not in use, and in order to enable the tray to be cleaned more easily, the top face 11 of the frame 10 includes grooves 17 set back along the edges 13a-13d of the work surface 13. These grooves 17 match the sizes of the force applicators 31, 41 so as to be capable of receiving them in the frame 10 while the tray 1 is not in use.

Figure 3A:
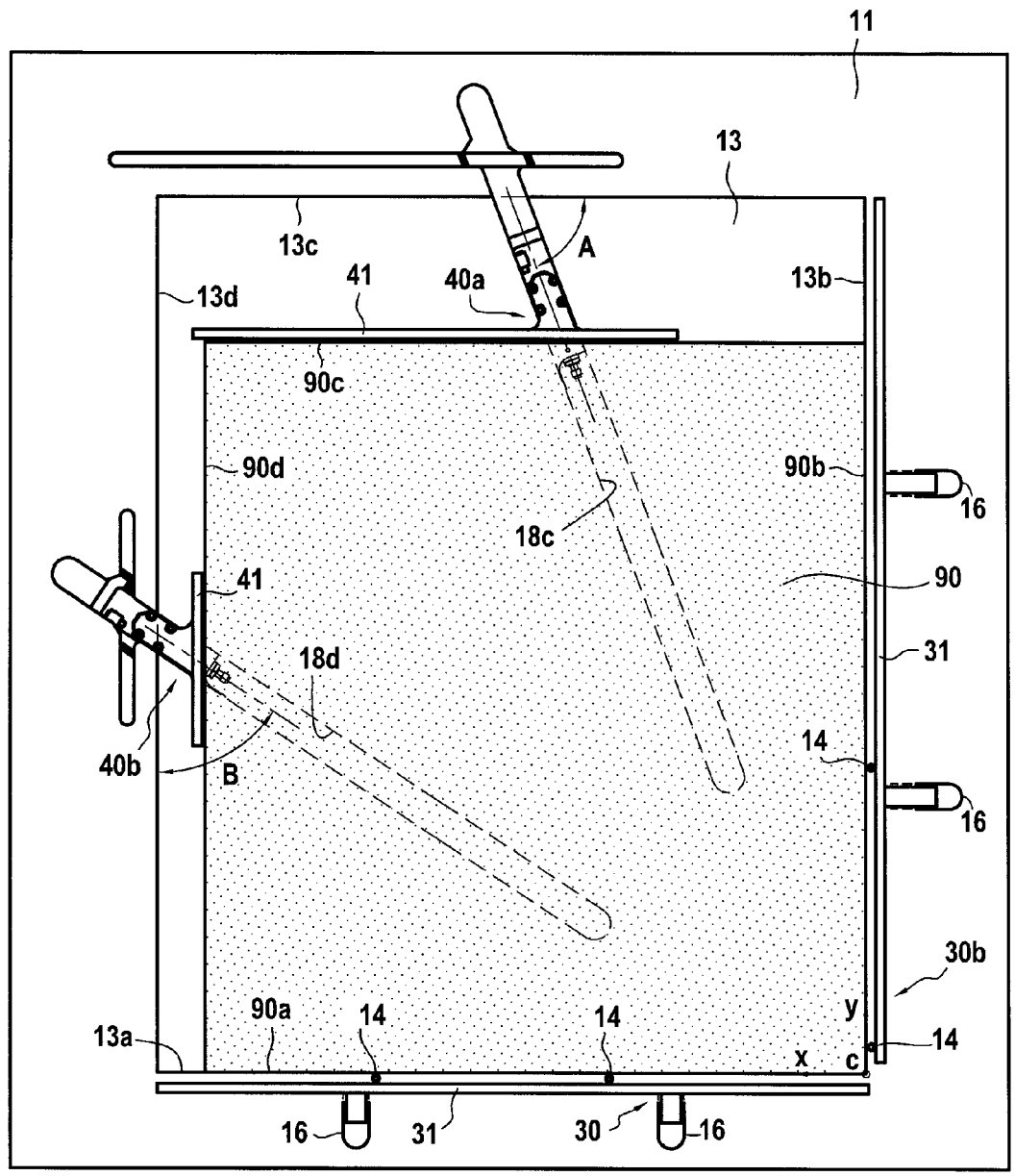
FIGS. 3A and 3B show respectively the resting state and the holding state of the holder devices of the tray when a panel of large size is in use.
Figure 3B:
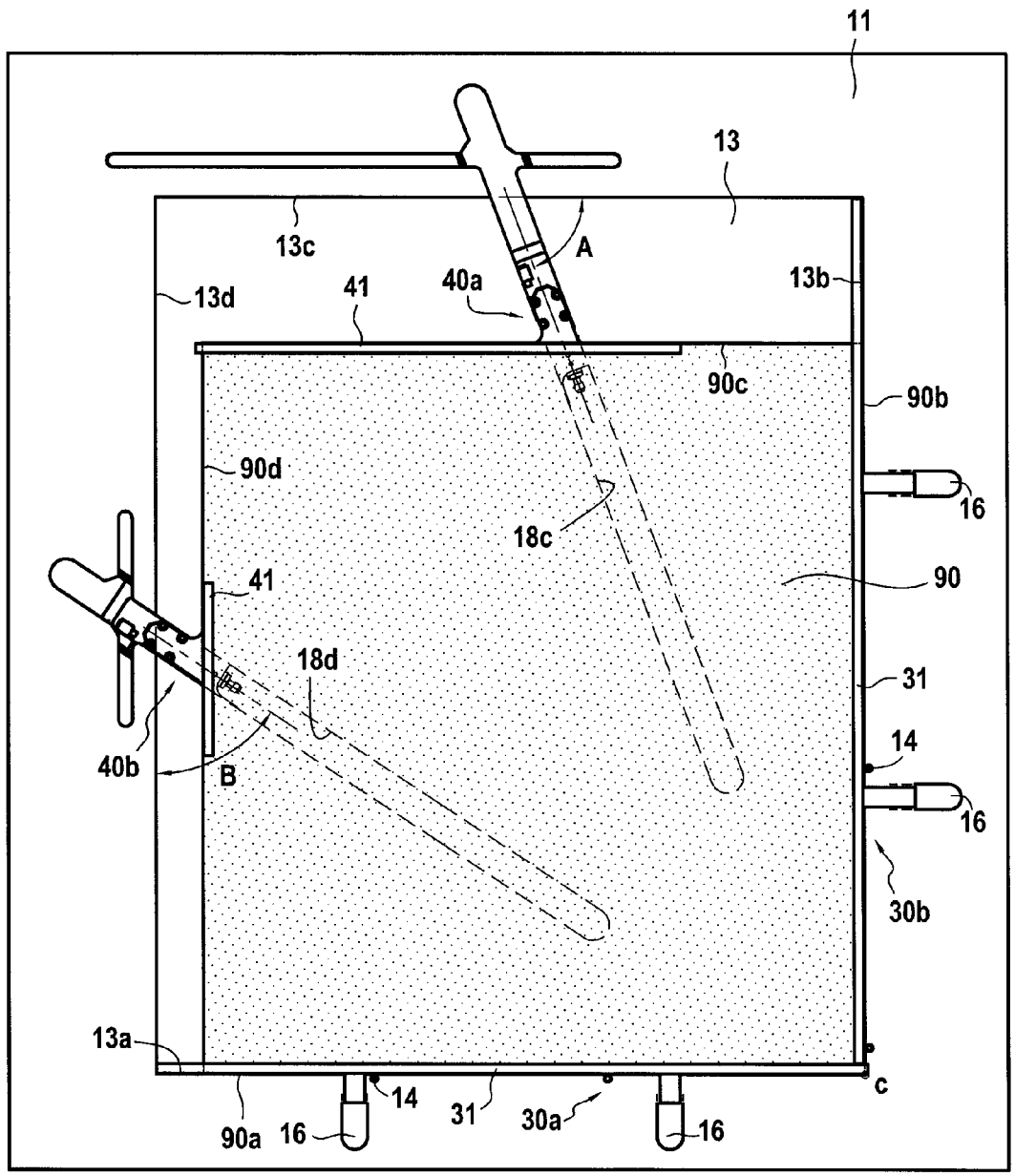
Figure 4A:
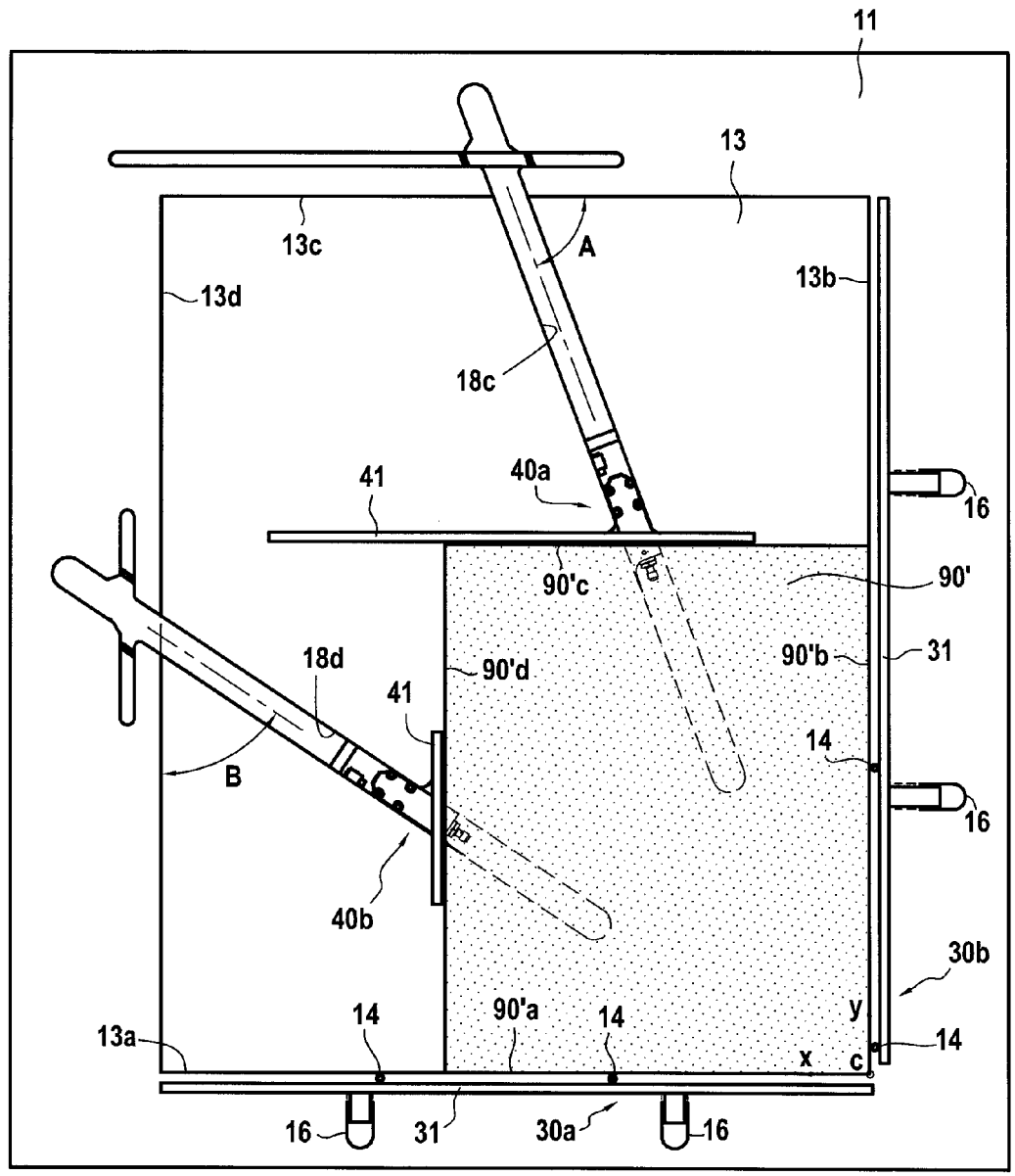
FIGS. 4A and 4B show respectively the resting state and the holding state of the holder devices when a panel of small size is in use.
Figure 4B:
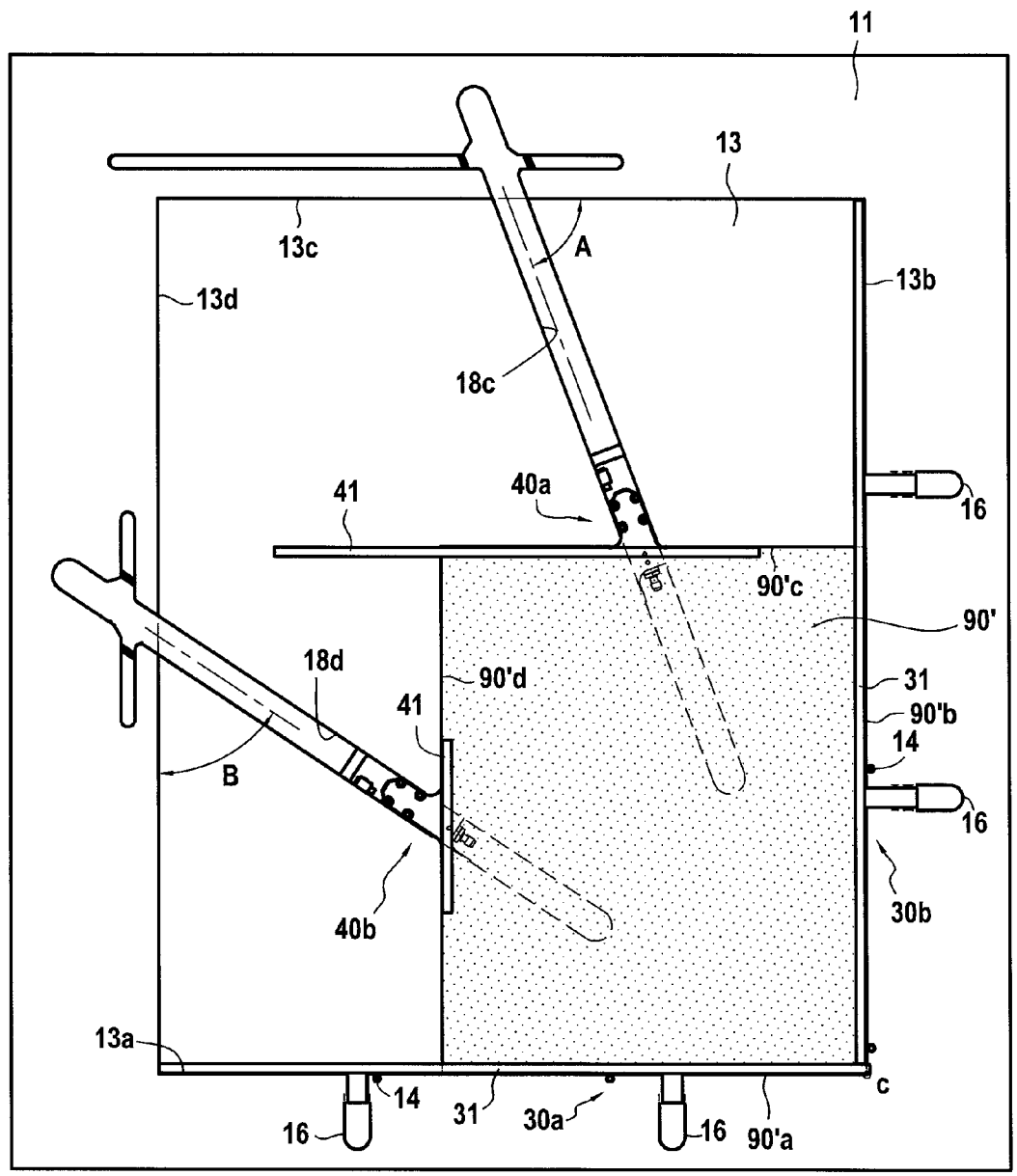

The operation of the tray 1 is described below with reference to FIGS. 3A, 3B, 4A, and 4B. In the example of FIGS. 3A and 3B, a panel 90 of large size is being used, whereas in the example of FIGS. 4A and 4B, a smaller panel 90' is being used.

When a new series of panels 90 is to be exposed, the tray 1 is initialized by setting the size, i.e. the length and the width of the panels 90 used. The holder devices 40a, 40b of the second type are then driven by the mover devices so as to bring each force applicator 41 into a rest position in which the force applicators extend along and set back a little from the positions expected for the third and fourth edges 90c, 90d of the panel 90, and at a distance from the top surface 11 of the frame 10. Typically, a horizontal gap of about 10 mm is provided relative to the edges of the panel 90, and a vertical gap of about 20 mm is provided relative to the top surface 11.

The holder devices 30a, 30b of the first type are actuated so as to bring each force applicator 31 into a rest position, in which the force applicators extend along and set back a little from the first and second edges 13a and 13b of the work surface 13 and at a distance from the top surface 11 of the frame 10. Typically, a horizontal gap of about 25 mm is provided relative to the edges 13a and 13b of the work surface 13, and a vertical gap of about 20 mm is provided relative to the top surface 11.

In this initial position, an operator 99 can place an unexposed panel 90 on the work surface 13 and position it against the first and second edges 13a, 13b and against the reference corner C of the work surface 13 by pushing it against the top 14. This configuration is shown in FIG. 3A.

Once the panel is properly positioned, the operator 99 can cause the holder devices 30a, 30b, 40a, and 40b to move into the holding state. In this state, the second actuators 38 of the holder devices 30a and 30b of the first type move the force applicators 31 horizontally over the first and second edges 90a and 90b of the panel 90. Thereafter, the first actuators 36 of the holder devices 30a, 30b move the force applicators 31 vertically towards the work surface 13 so as to reach a holding position in which they exert a vertical force against the panel 90.

When the holder devices 40a, 40b of the second type pass to the holding state, the mover devices 49 move the force applicators 41 horizontally over the third and fourth edges 90c, 90d of the panel 90. Thereafter, the jacks 45 of these holders devices 40a, 40b move the force applicators 41 vertically towards the work surface 13 so as to reach respective holding positions in which they exert force vertically against the panel 90. This configuration is shown in FIG. 3B.

In such a configuration, the panel 90 is retained pressed firmly against the work surface 13 and is then ready to be presented facing an exposure device. In particular, it should be observed that the four corners of the panel 90, substantially the entire length of its first and second edges 90a and 90b, and a major portion of its third edge 90c, i.e. at least half of its length, and at least a middle portion of its fourth edge 90d, are thus pressed down by the force applicators 31, 41.

Once exposure has terminated, the holder devices return to the rest positions of FIG. 3A, thereby releasing the exposed panel 90: the operator 99 can then remove the panel 90 in order to put a new panel into place and begin a new cycle. It can naturally be understood on this topic that the operator 99 could perfectly well be replaced by a mechanical gripper and conveyer device for loading and unloading panels 90 automatically.

When a panel 90' of smaller size is used, the holder devices 40a and 40b of the second type are advanced towards the interior of the work surface 13 by the mover devices so as to cause their rest and holding positions to be matched to the size of the new panel 90'. The stroke of these holder devices 40a and 40b are oblique relative to the edges 13c and 13d of the work surface 13.

More precisely, the stroke of the first holder device 40a of the second type, which can be assessed by looking at the slot 18c, forms an angle A with the third edge 13c of the work surface 13, i.e. with the first direction X, that is approximately equal to 70°. In this way, the first holder device 40a of the second type can retain the fourth corner of the panel 90' together with a major portion of the third edge 90'c, in spite of the smaller size of the panel 90'.

The stroke of the second holder device 40b of the second type, that can be seen by looking at the slot 18d, forms an angle B with the fourth edge 13d of the work surface 13, i.e. with the second direction Y, that is equal to about 56°. In this way, the second holder device 40b of the second type can retain a middle portion of the fourth edge 90'd in spite of the smaller size of the panel 90'.

Figure 8:
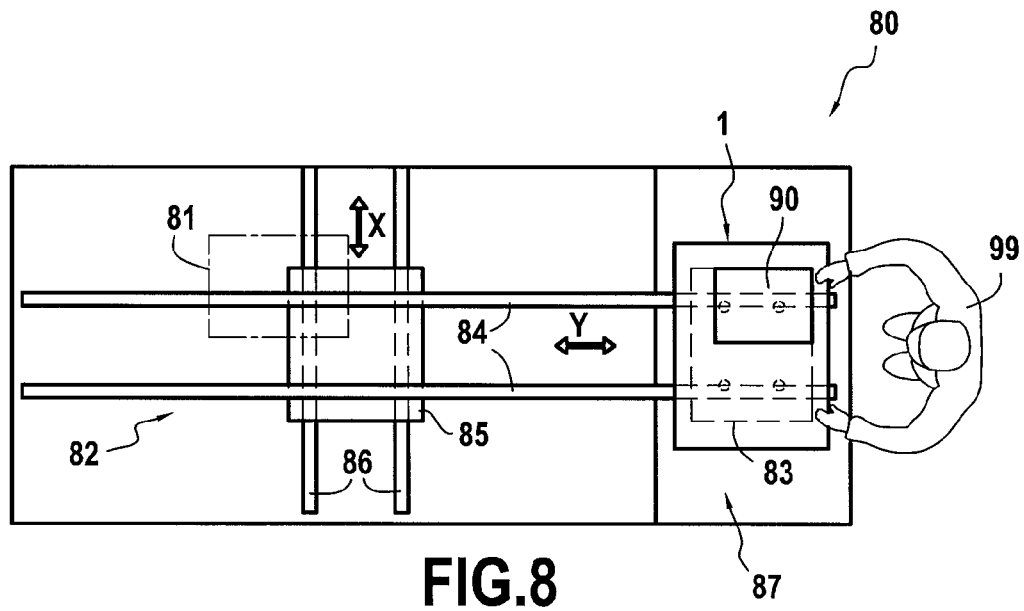
FIG. 8 is a plan view of an exposure machine of the invention.
Figure 9:
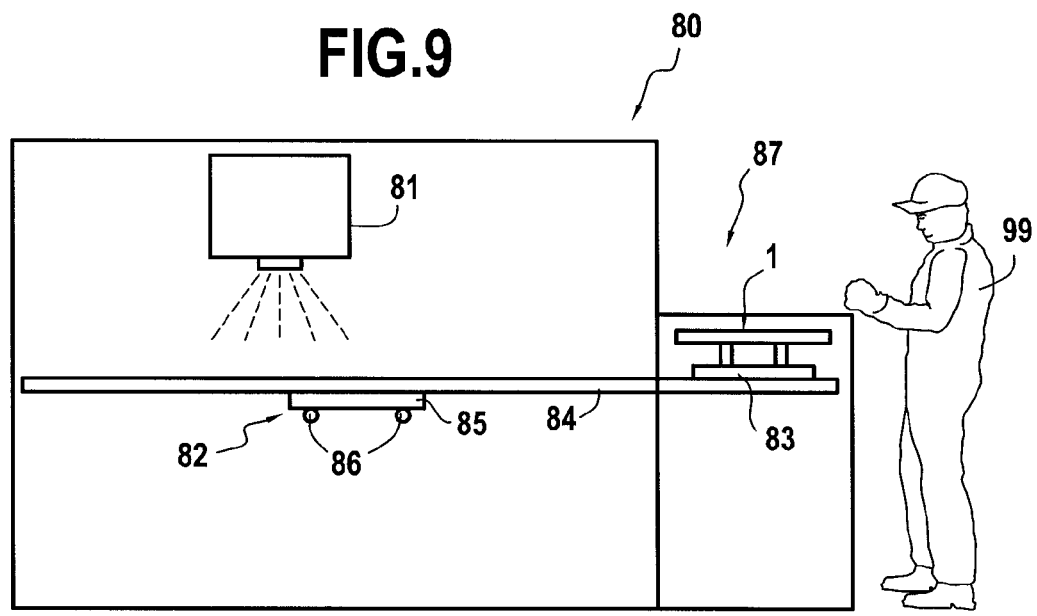
FIG. 9 is a profile of the same machine.

An example exposure machine 80 is described below with reference to FIGS. 8 and 9. This exposure machine 80 includes an exposure head 81 of the direct imaging type, e.g. comprising a matrix of controllable micro-mirrors capable of projecting an image based on a digital negative. The exposure machine 80 also has a tray 1 in accordance with the invention, e.g. as described above, for holding a panel 90 that is to be exposed.

The machine 80 also has a two-dimensional mover device 82 capable of moving the tray 1 in a horizontal plane along two directions X and Y. For this purpose, the tray may be fastened on a first carriage 83 that is movable along first rails 84 parallel to the first direction X, these first rails themselves being carried by a second carriage 85 that is movable along second rails 86 parallel to the second direction Y. In this way, it is possible to move the tray 1 between a loading zone 87 where an operator 99 works to load and unload panels 90, and a zone facing the exposure head 81.

Furthermore, when the panel 90 is greater than the size of the image that can be projected by the exposure head, the mover device enables the panel 90 to be exposed in pieces, by causing the panel to move into successive positions facing the exposure head 81.

In order to ensure that the image is accurately aligned while it is being projected, including when the projected image changes while the tray 1 is moving, the mover device 82 is configured to provide the tray 1 with absolute positioning accurately of the order of 3 µm even while the tray 1 is moving, with this being possible up to a travel speed of the order of 420 millimeters per second (mm/s). When necessary, the mover device 82 may be configured to achieve maximum speeds of up to 800 mm/s.

The embodiments described in the present description are given by way of non-limiting illustration, and in the light of this description, a person skilled in the art can easily modify these embodiments or can envisage others, while remaining within the scope of the invention.

Furthermore, the various characteristics of these embodiments may be used singly or in combination with one another. When they are combined, these characteristics may be combined as described above or in other ways, the invention not being limited to the specific combinations described in the present description. In particular, unless specified to the contrary, a characteristic that is described with one embodiment may be applied in analogous manner to another embodiment.

What is claimed:

1. A tray adapted to present a panel facing an exposure device in a panel exposure machine, the tray comprising:
   a work surface adapted to receive panels of different sizes, said work surface being substantially plane and possessing first and second adjacent edges extending along substantially orthogonal first and second directions defining a reference corner; and
   first and second holder devices of a first type and at least a first holder device of a second type, each holder device being actuatable between a holding, first state in which it exerts pressure directed towards the work surface, thereby defining a holding position, and a rest, second state in which said pressure is released; and
   a positioning device arranged along at least a portion of the first edge and along at least a portion of the second edge;
   wherein the holder devices of the first type extend along at least a portion of the first and second edges respectively, their holding positions being fixed in a plane parallel to the work surface; and
   wherein the holder device of the second type is movable in a plane parallel to the work surface in order to adapt its holding position as a function of the size of the panel in use.

2. A tray according to claim 1, wherein the positioning device comprises at least one stop provided against the first edge and/or the second edge of the work surface.

3. A tray according to claim 1, wherein the first holder device of the second type is movable in translation along a stroke extending at least from a third edge of the work surface towards the interior of the work surface substantially towards the first holder device of the first type.

4. A tray according to claim 3, wherein the stroke of the first holder device of the second type forms an angle with the first direction that lies strictly between 45° and 90°.

5. A tray according to any one of claims 1 to 4, including a second holder device of the second type,
   wherein the second holder device of the second type is movable in translation along a stroke extending at least from a fourth edge of the work surface towards the inside of the work surface and substantially towards the second holder device of the first type; and
   wherein said stroke forms an angle with the second direction lying strictly between 45° and 90°.

6. A tray according to claim 3, wherein the maximum stroke of at least one holder device of the second type extends over at least 10 cm, and wherein the maximum lateral travel of the holder devices of the first type is less than 10 cm.

7. A tray according to claim 1, including at least one first mover device for moving at least one holder device of the second type.

8. A tray according to claim 7, wherein the first mover device comprises a wormscrew co-operating with a nut secured to said holder device of the second type.

9. A tray according to claim 1, wherein at least one holder device includes a force applicator actuated by an actuator device configured to lower the force applicator towards the work surface in the holding state and to lift the force applicator to a distance from the work surface in the rest state.

10. A tray according to claim 9, wherein the position of the force applicator in the rest state is higher and further out than its position in the holding state.

11. A tray according to claim 9 or claim 10, wherein the actuator device of at least one holder device of the first type comprises a first actuator configured to lift or lower the force applicator and a second actuator configured to cause the force applicator to advance or retreat laterally.

12. A tray according to claim 1, including at least one first mover device for moving at least one holder device of the second type,
wherein at least one holder device includes a force applicator actuated by an actuator device configured to lower the force applicator towards the work surface in the holding state and to lift the force applicator to a distance from the work surface in the rest state, and
wherein the actuator device of at least one holder device of the second type comprises a single actuator configured to lift or to lower the force applicator, and wherein the corresponding mover device is configured to cause the force applicator to advance or retreat laterally.

13. A tray according to claim 1, further including a suction device configured to retain a panel against the work surface by suction.

14. A panel exposure machine comprising an exposure device and a tray according to claim 1 and adapted to present a panel facing the exposure device.

15. A machine according to claim 14, wherein said tray is movable relative to the exposure device in a plane parallel to the work surface.

* * * * *